US005652862A

United States Patent [19]
Hanson

[11] Patent Number: 5,652,862
[45] Date of Patent: Jul. 29, 1997

[54] METHOD AND APPARTUS FOR DETERMINING A PRECISION OF AN INTERMEDIATE ARITHMETIC FOR CONVERTING VALUES BETWEEN A FIRST NUMERIC FORMAT AND A SECOND NUMERIC FORMAT

[75] Inventor: Kenton L. Hanson, St. John, Virgin Islands (U.S.)

[73] Assignee: Apple Computer, Inc., Cupertino, Calif.

[21] Appl. No.: 523,681

[22] Filed: Sep. 5, 1995

Related U.S. Application Data

[63] Continuation of Ser. No. 998,535, Dec. 30, 1992, abandoned.
[51] Int. Cl.[6] .................................................. G06F 7/38
[52] U.S. Cl. ................ 395/492; 364/715.03; 364/745.01
[58] Field of Search ............................ 364/715.03, 745, 364/748, 736; 395/492

[56] References Cited

PUBLICATIONS

Coonen, Jerome, "Contributions to a Proposed Standard for Binary Floating-Point Arithmetic", Jun. 1984, pp. 1.1–D.19.
Gay, David, "Correctly Rounded Binary-Decimal and Decimal-Binary Conversions", AT&T Numerical Analysis Manuscript 90-10, Nov. 1990 pp. 1–16.

"Apple Numerics Manual, Second Edition" Apple Computer, Inc. 1988, pp. iii–xxii, 3–10, 19–34, 99–103, 155–159.

*Primary Examiner*—Reba I. Elmore
*Attorney, Agent, or Firm*—Blakely, Sokoloff, Taylor & Zafman

[57] ABSTRACT

A method and apparatus for efficient allocation of temporary storage for performing accurate and correct numeric base conversions on a computer system is provided. Numeric base conversions are common because computers operate in binary whereas the values that are input into computers are based on a decimal system. A common source of error occurs when converted values are rounded. The intermediate arithmetic used to perform the conversion requires greater precision than the target floating point format. It is known that to always insure correctly rounded results, an extremely high precision intermediate arithmetic may be used. However, in many case this is a waste of system memory. To efficiently allocate system memory to this task, the most difficult rounding case is determined. The precision needed to correctly round the most difficult case is then derived. This information is then stored and subsequently used to allocate an efficient amount of storage whenever a numeric base conversion is to take place.

9 Claims, 6 Drawing Sheets

Fig. 6

| CASE | BINARY SIGNIFICAND | NUMBER LINE | DECIMAL SIGNIFICAND | CASE |
|------|--------------------|-------------|--------------------|------|
| 1 | 1101— — — — — — —1011.0000* | ▼ | | |
| 2 | 1101— — — — — — —1011.0001 | ▼ | | |
| 3 | 1101— — — — — — —1011.0010 | ▼ | | |
| 4 | 1101— — — — — — —1011.0011 | ▼ • | 9348— — — —343 | A |
| 5 | 1101— — — — — — —1011.0100 | ▼ | | |
| 6 | 1101— — — — — — —1011.0101 | ▼ | | |
| 7 | 1101— — — — — — —1011.0110 | ▼ | | |
| 8 | 1101— — — — — — —1011.0111* | ▼ | | |
| 9 | 1101— — — — — — —1011.1000* | ▼ • | 9348— — — —344 | B |
| 10 | 1101— — — — — — —1011.1001 | ▼ | | |
| 11 | 1101— — — — — — —1011.1010 | ▼ | | |
| 12 | 1101— — — — — — —1011.1011 | ▼ | | |
| 13 | 1101— — — — — — —1011.1100 | ▼ | | |
| 14 | 1101— — — — — — —1011.1101 | ▼ • | 9348— — — —345 | C |
| 15 | 1101— — — — — — —1011.1110 | ▼ | | |
| 16 | 1101— — — — — — —1011.1111* | ▼ | | |
| 17 | 1101— — — — — — —1100.0000* | ▼ | | |
| 18 | 1101— — — — — — —1100.0001 | ▼ | | |

METHOD AND APPARTUS FOR DETERMINING A PRECISION OF AN INTERMEDIATE ARITHMETIC FOR CONVERTING VALUES BETWEEN A FIRST NUMERIC FORMAT AND A SECOND NUMERIC FORMAT

This is a continuation of application Ser. No. 07/998,535, filed Dec. 30, 1992, now abandoned.

BACKGROUND OF THE INVENTION

1. Field of the Invention

The present invention relates to the field of memory management, in particular to efficient allocation of storage for performing numeric conversions with correctly rounded results.

2. Description of the Related Art

On a computer system, it is very common to convert numbers between a binary base and a decimal base. This is because most computer systems operate on binary numbers, whereas most commercial and scientific numerical operations are performed on numbers with a decimal base.

In many cases, conversions between numeric bases are approximations where numbers have a fractional portion. Such numbers are represented in binary as floating point numbers. A case where there is an exact representation is 0.5 (decimal) which is represented as 0.1 (binary). But for most cases, the fractional portion of a decimal number cannot be exactly converted. This phenomenon also occurs for large floating point numbers that cannot be exactly represented with limited significance of binary computer formats.

Numeric conversions are carried out in compilers, language libraries, interactive debuggers, digital signal processors, financial application software and for many other tools. Any system that must convert from one base numeric system to another base numeric system must perform such conversions. A complete discussion on the implications and effects of numeric representations and conversions is found in a publication entitled "Apple Numerics Manual, Second Edition", 1988 published by the Addison-Wesley Publishing Company, ISBN No. 0-201-17738-2.

As binary storage formats generally provide only close approximations to decimal values, it is important that conversions between the two types be as accurate as possible. Errors are introduced into a numeric representation when it is incorrectly rounded. A numeric representation may be incorrectly rounded when the representation does not contain enough information for making the rounding decision. As an example, when two numbers with fractional portion are multiplied, the fractional portion of the result is the sum of the widths of the fractional portions of the numbers being multiplied. In order to fit this back into the original numeric format, the result must be rounded. If there is not enough information to insure correct rounding, erroneous results may occur. Given a rounding direction, for every decimal value there is a best, correctly rounded, binary value for each binary format. Conversely, for any rounding direction, each binary value has a corresponding best decimal representation for a given decimal format. Ideally, conversion between binary and decimal conversions should obtain this best value to reduce accumulated errors and provide consistent results.

A typical way of converting a number between binary and decimal is to scale a binary integer by an appropriate power of ten. Previously, it has been necessary to compute to extremely high precision to guarantee correctly rounded conversions between binary and decimal. A known way to accurately scale a binary or decimal number by a binary power of ten is to require that both the number being scaled and the power of ten be exact. Conversions near the extremes of typical floating point ranges can require exact powers of ten near $10^{5000}$ whose exact representation requires 11,610 bits.

It is easy to perform the arithmetic but the storage required for computation is large and the computation times can be excessive. As a result, most commercial compilers and runtime systems use approximate conversions to reduce storage requirements and conserve computing resources.

It is known in the art to use extremely wide precision arithmetic to guarantee correctly rounded conversions. For example, in his Ph.D. Thesis entitled "Contribution to a Proposed Standard for Binary Floating-Point Arithmetic", Department of Mathematics, University of California, Berkeley, June 1984, Jerome T. Coonen, describes an algorithm using the extremely wide precision arithmetic concept. However, as noted above, use of extremely wide precision arithmetic requires large amounts of storage and a great deal of computing resource.

A second approach proposed by David M. Gay suggested that double precision arithmetic be used where suitable, and super high precision arithmetic be used when results are indecisive ("Correctly Rounded Binary-Decimal and Decimal-Binary Conversions", Technical Report, AT&T Bell Laboratories, November, 1990). However, this still does not negate the need for performing the super high precision when necessary.

Thus, in the known art, it is necessary to utilize large amounts of temporary storage to guarantee correct rounding results for all cases. It is an object of the present invention to provide an efficient and accurate method and apparatus for determining on efficient amount of storage needed for performing numerical base conversions an a computer system. Once this has been determined, efficient and correctly rounded base conversions can be guaranteed without 1) further difficult case checking or 2) potential large storage allocations. The minimal necessary storage allocation can be determined for specified source and destination formats.

SUMMARY

A method and apparatus for efficient allocation of storage when performing numeric base conversions of floating point numbers on a computer system, is disclosed. To guarantee accurate results when performing a conversion, a sufficiently large intermediate storage for performing rounding operations is required. However, overly large storage allocations are wasteful. Efficient storage allocation is desirable in order to maximize use of the Random Access Memory (RAM) of a computer system. The amount of RAM needed to perform operations in an intermediate arithmetic used to perform numeric conversions in the target formats is determined. Whenever a conversion of a value in the target formats is invoked, the predetermined amount of storage is allocated. A net effect is to have infinite precision in a finite amount of storage.

It has been determined that an intermediate arithmetic with precision equal to twice the width of the target floating point format including the exponent field for the format plus several (e.g. 8 or 16) extra bits is sufficient to guarantee correctly rounded conversions between binary and decimal. Determining the width needed requires identification of the most difficult rounding case. Difficult cases are those in which there is not sufficient information to accurately round to a significant digit. All cases that are not difficult can be accurately rounded. Identification of the most difficult rounding case is simplified by identifying a unique set of spacings that exist between difficult cases. When looking for difficult cases of increasing precision only the cases having the unique spacing need be examined. The number of bits to accurately round all cases can then be determined from the precision needed for rounding the most difficult case.

BRIEF DESCRIPTION OF THE FIGURES

FIG. 6 is an example of difficult rounding cases.

DETAILED DESCRIPTION OF THE PREFERRED EMBODIMENT

A method and apparatus for allocating temporary storage for performing arithmetic numeric base conversions is disclosed. In the following description, numerous specific details, e.g. techniques for performing numeric conversions are set forth in order to provide a thorough understanding of the present invention. It will be apparent, however, to one skilled in the art that the present invention may be practiced without such specific details. In other instances, specific implementation details, such as operating system interfaces have not been shown in detail in order not to unnecessarily obscure the present invention.

In the description of the present invention, various terms well known to those skilled in the art are used. The term bit refers to a single storage unit of binary information. The phrase numeric base conversion refers to transforming a value from one numeric format, e.g. floating point binary, to another numeric format, e.g. decimal. Finally, the term rounding refers to truncation of a numeric representation in order to have it fit into a particular numeric format.

OVERVIEW OF A COMPUTER SYSTEM IN THE PREFERRED EMBODIMENT

Figure 1:
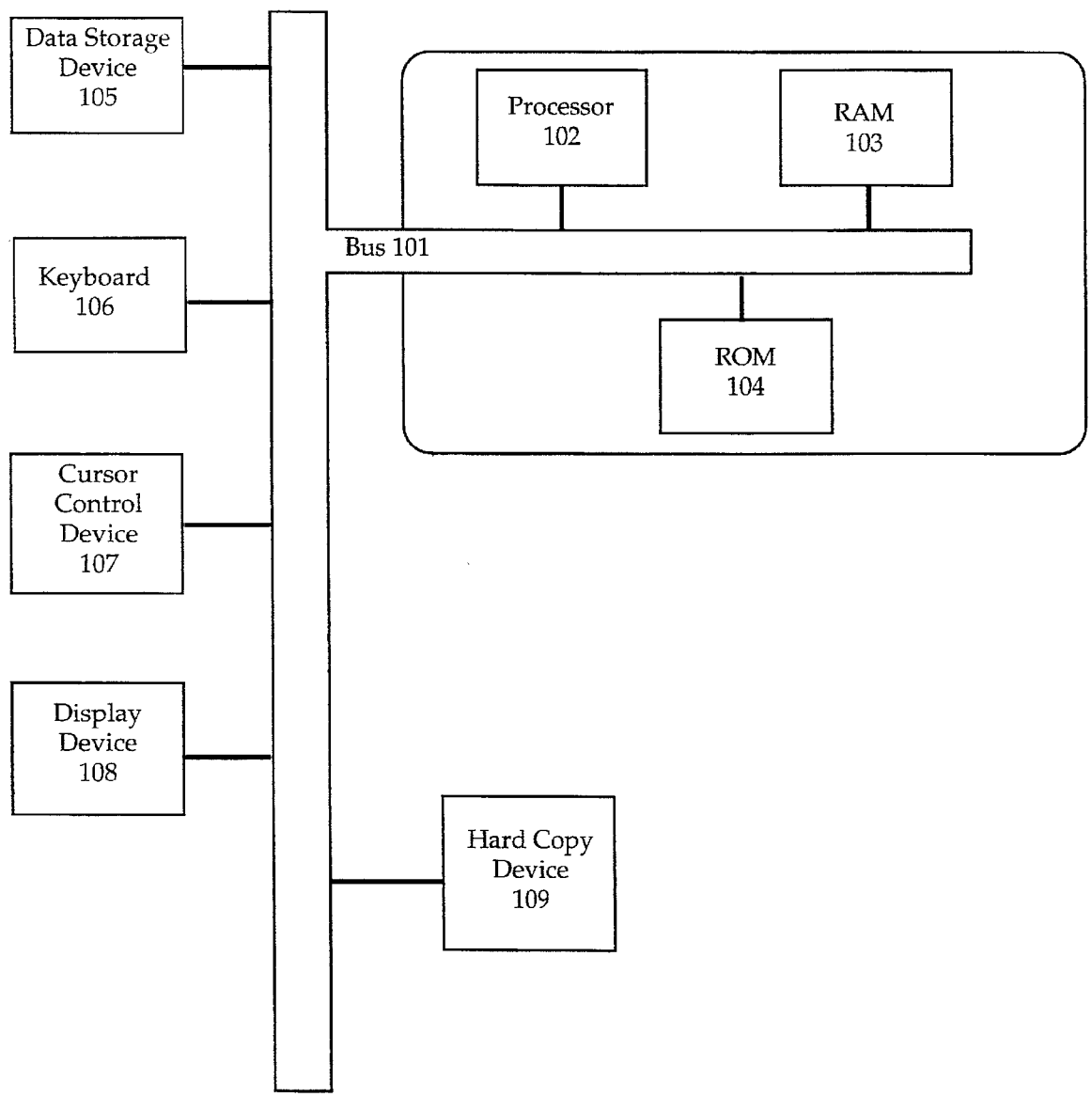
FIG. 1 is a block diagram of a computer system of the currently preferred embodiment of the present invention.

The computer system of the preferred embodiment is described with reference to FIG. 1. The present invention may be implemented on a general purpose microcomputer, such as one of the members of the Apple® Macintosh® family, one of the members of the IBM compatible Personal Computer family, or one of several work-station or graphics computer devices which are presently commercially available. In any event, a computer system as may be utilized by the preferred embodiment generally comprises a bus or other communication mechanism 101 for communicating information, a processor means 102 coupled with said bus 101 for processing information, a random access memory (RAM) or other storage device 103 (commonly referred to as a main memory) coupled with said bus 101 for storing information and instructions for said processor 102, a read only memory (ROM) or other static storage device 104 coupled with said bus 101 for storing static information and instructions for said processor 102, a data storage device 105, such as a magnetic disk and disk drive, coupled with said bus 101 for storing information and instructions, an alphanumeric input device 106 including alphanumeric and other keys coupled to said bus 101 for communicating information and command selections to said processor 102, a cursor control device 107, such as a mouse, track-ball, cursor control keys, etc., coupled to said bus 101 for communicating information and command selections to said processor 102 and for controlling cursor movement, and a display device 108 coupled to said bus 101 for displaying visual data. Additionally, it is useful if the system includes a hard copy device 109, such as a printer, for providing permanent copies of information. The hard copy device 109 is coupled with the processor 102 through bus 101.

It should be noted that the processor 102 may be used to perform various steps needed in the calculation of the optimal storage size and the calculation for the numeric conversions. The temporary storage which is allocated is located in the RAM 103.

As described with reference to the prior art, conversions between binary and decimal bases may be performed by scaling a binary integer to another binary integer by an appropriate power of ten. In the currently preferred embodiment, the conversion takes place using an intermediate arithmetic having a precision greater than that of the target floating point format. The intermediate results must be rounded to fit within the target floating point format. Further, the intermediate results must be rounded correctly in order to obtain accurate results. If the scaling operation is performed with exact inputs, the binary result before rounding may be an infinitely long bit pattern.

The precision used in the intermediate arithmetic operations performed in numeric conversions is critical to the accuracy of the results. The precision must be wide enough so that all intermediate results for a particular floating point format can be correctly rounded. If the intermediate results are not accurately rounded, errors may be generated and propagated.

The need for consistent and accurate results is balanced with the need for efficient memory allocation. Inefficient memory allocation, i.e. the use of an overly wide precision, wastes computer system resources, namely memory and processing resources. Thus, a need for efficient allocation of memory while providing for accurate and consistent results is highly desirable.

The present invention provides for correct results according to the Institute of Electronics and Electrical Engineers (IEEE) Standards 754 and 854 for Floating Point Arithmetic. The IEEE 754 and 854 standards define numerous floating point formats including single, double and extended arithmetic data types. As these floating point formats are a defined standard, no further discussion of the formats is deemed necessary. It should also be noted that the present invention may also be used for allocation of storage for conversion of numbers having any numeric bases.

Memory Allocation of the Currently Preferred Embodiment

The present invention is based on the observation that intermediate arithmetic having a width that is sufficient to convert the most difficult binary to decimal and decimal to binary conversions is sufficient for all easier conversions. In the currently preferred embodiment, the predetermined width is twice the width of the target floating point format including the exponent field plus a several extra bits. Generally, eight (8) or sixteen (16) extra bits are needed.

Figure 2:
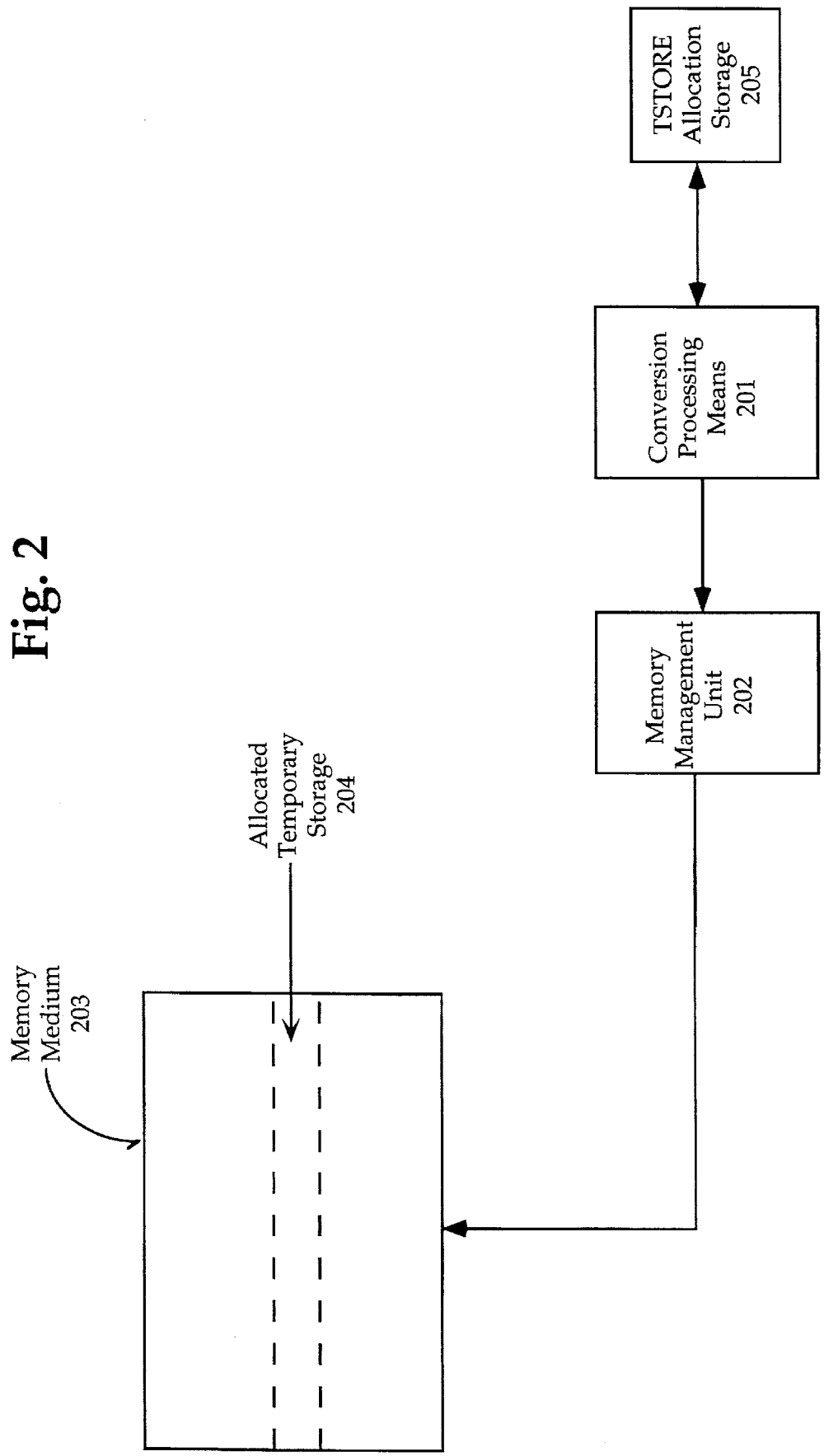
FIG. 2 is a block diagram of the memory allocation portion of a computer system of the currently preferred embodiment of the present invention.

Memory allocation is described with reference to FIG. 2. A portion of a memory medium 203, for example the RAM 103 of FIG. 1, is allocated for use by a conversion processing unit 201. The conversion processing unit 201 may be a program running on a processor. The conversion processing means 201 may be a utility that is embodied within an application program, compiler or interactive debugger. Temporary storage 204 is allocated out of the memory medium 203. The memory medium 203 is of fixed size. In order to maximize use of the memory medium 203, minimizing the size of temporary storage 204 is desirable.

The allocation of temporary storage 204 in memory medium 203 is handled by memory management unit 202. Memory management unit 202 may perform various other functions such as virtual memory management, paging and address translations.

The conversion processing unit 201 will have associated with it a TSTORE allocation storage 205. The TSTORE allocation storage 205 will include the size of a temporary storage area for conversions in each particular floating point format. So whenever a numeric conversion occurs, the conversion processing unit 201 retrieves an entry in the TSTORE allocation storage 205. Note that the TSTORE allocation storage 205 may be a set of values that are imbedded within a program. This value is passed to the memory management unit 202. The memory management unit 202 then allocates the desired amount of storage from the memory medium 203.

Figure 3:
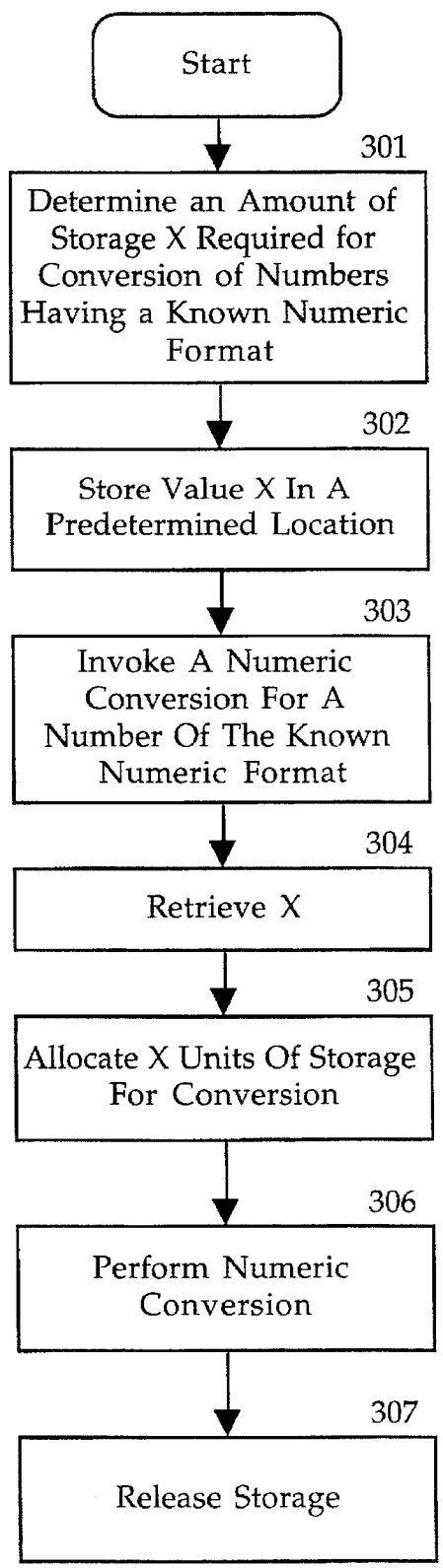
FIG. 3 is a flowchart illustrating the steps of temporary storage allocation as may be performed by the currently preferred embodiment of the present invention.

The steps of temporary storage allocation are further described with reference to the flowchart of FIG. 3. First, the amount of storage required for conversion of numbers having a known numeric format is determined, step 301. As will be described in more detail below, this requires the identification of the most difficult rounding case for the target given binary and decimal number formats. Once this value is determined, it is stored in a predetermined location, step 302. As described above, this predetermined location may be in a TSTORE allocation storage, or may be stored directly within a conversion program.

A numeric conversion is then invoked, step 303. As noted above, in order to provide accurate and consistent results, the numeric conversion will require an intermediate arithmetic of precision that is greater than the target floating point format. In order to allocate the temporary storage needed to perform the intermediate arithmetic, the appropriate TSTORE allocation value is retrieved, step 304. The needed storage is then allocated by the memory management unit, step 305. The storage allocation is performed by conventional methods known by those skilled in the art. The conversion is then performed, step 306. As described above, this may be performed by scaling a binary integer by an appropriate power of ten. In any case, various arithmetic operations will be performed. Once the conversion is performed, the temporary storage is released, step 307.

Determining the Precision of the Intermediate Arithmetic

It has been determined that the precision of the intermediate arithmetic for performing base conversions should be approximately twice the width of the target floating point format plus the width of the exponent field plus a few extra bits. This is the precision, i.e. the number of bits, needed to accurately and consistently round the most difficult rounding case when performing conversions for a particular floating point format. The most difficult rounding case refers to a value in a source numeric format which requires the greatest amount of information, i.e. number of bits, to correctly round to a target numeric format. Given this required precision, the minimum amount of storage that is needed is allocated.

In the currently preferred embodiment, finding the most difficult case is an iterative process where difficult cases are identified. Difficult rounding cases are those in which there is not sufficient information, i.e. precision, to accurately round a number to a significant digit in the target numeric format. In other words, difficult rounding cases span two potentially correct answers. Difficult rounding cases are described in more detail below.

Figure 4:
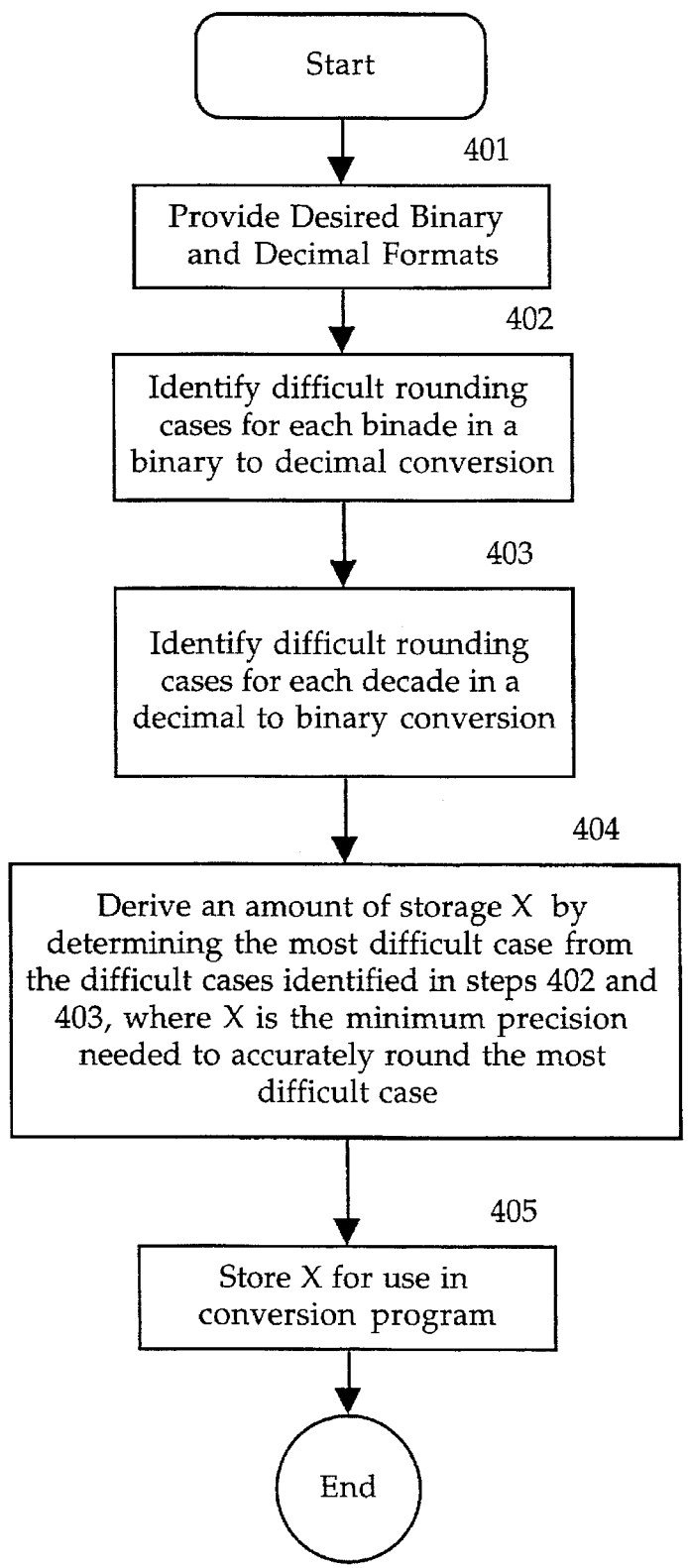
FIG. 4 is a flowchart describing the steps taken for determining the minimum amount of storage needed for performing accurate conversions as may be utilized in the preferred embodiment of the present invention.

FIG. 4 is a flowchart illustrating how the minimum amount of storage needed for correctly rounding a number for a particular floating point format is derived in the currently preferred embodiment. First the desired decimal and binary formats are provided step 401. From these formats the difficult rounding cases for both decimal to binary and binary to decimal are determined. The method requires that difficult cases be examined individually by decade and binade. Decade and binade refer to the range of values for each decimal and binary exponent. This is because the spacing of difficult cases is unique. The difficult rounding cases for each binade in a binary to decimal conversion are then found, step 402. Similarly, the difficult cases for each decade in a decimal to binary conversion are found, step 403. Identification of difficult cases is described in more detail below.

Once the difficult cases are identified, the amount of intermediate storage X needed to correctly round the most difficult case is determined, step 404. This is done by increasing the precision until all cases can be correctly rounded. The resulting precision represents the number of bits needed to provide information for correctly rounding in all directions. The value X is then stored, step 405, so it may be accessed whenever a numeric conversion is required.

Finding Difficult Rounding Cases

Finding difficult cases can be problematic due to the high number of cases that must be considered. For each binade or decade we must consider all possible inputs that can produce a number in the desired output format. For any given scaling factor this number can be immense. So, the following method is used to find the spacing of difficult input values, that is, values difficult to convert given an intermediate precision arithmetic, Y. Ultimately, a minimum intermediate precision arithmetic is determined, i.e., storage size, that will correctly convert all possible inputs. The following method determines this minimum storage size for each possible scaling factor necessary for correct conversion. The method is repeated for each possible scaling factor to determine the minimum storage size necessary to correctly convert all possible input values. This is repeated for both directions of the base conversions.

Figure 5:
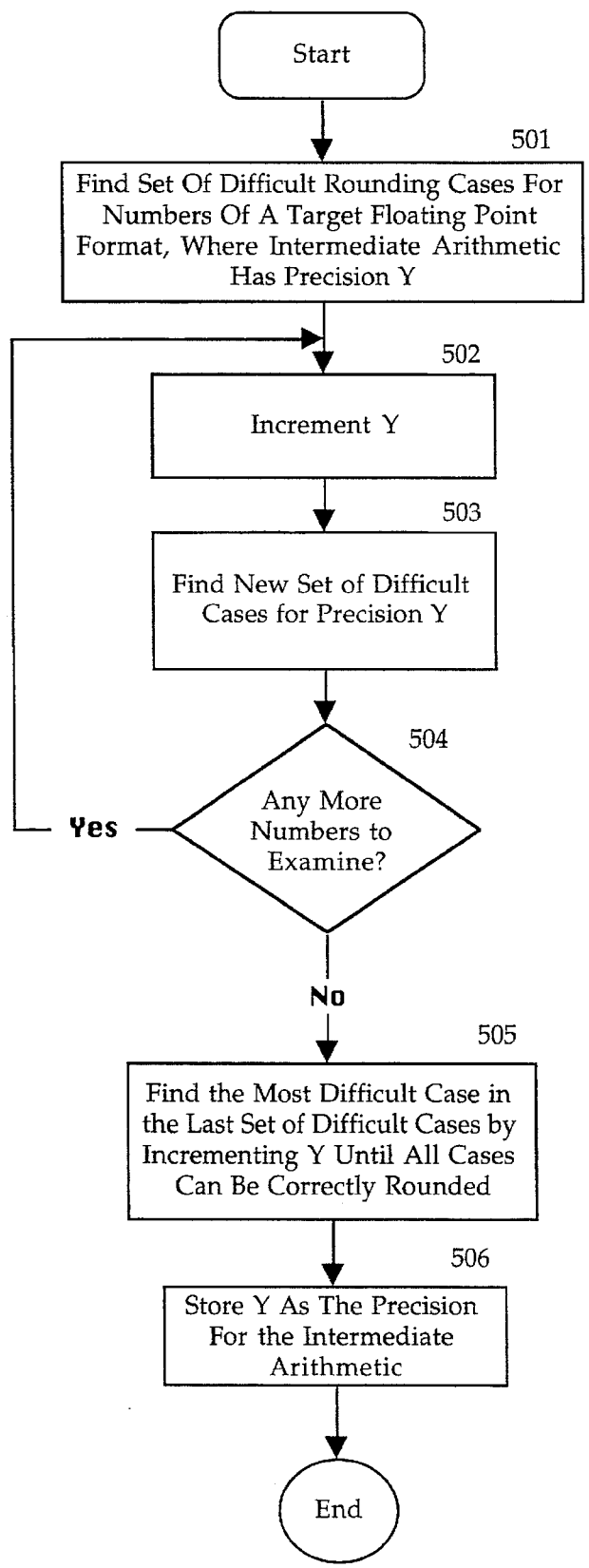
FIG. 5 is a flowchart describing the steps taken for finding difficult cases in the currently preferred embodiment of the present invention.

FIG. 5 is a flowchart describing the steps taken for finding a most difficult case. The difficult cases for numbers with a floating point format having an intermediate arithmetic of a starting precision Y is determined, step 501. The starting precision Y is equal to the width of the target floating point format plus the exponent field, plus four (4). Finding difficult cases has been greatly simplified by the observation that a fixed set of spacings exist between the difficult cases for a given intermediate precision. The determination of these fixed spacings significantly reduces the number of cases that have to be checked as being difficult case. These fixed spacings will be discussed in greater detail below. In the currently preferred embodiment, the result will be the fixed spacing for the precision Y. Once the fixed spacings are determined, checking for difficult cases stops. This is because the existence of such unique spacings indicates that the most difficult case has not been found. However, it would be apparent to one skilled in the art to use other techniques, e.g. saving each of the difficult cases. Utilization of such other techniques would not cause departure from the spirit and scope of the present invention.

The precision Y is then incremented by 1 bit, step 502. A new set of difficult cases for the increased precision is then identified, step 503. As step 501, this step is performed by identifying the spacings of difficult cases. Further, it can be seen that the set of numbers that generate difficult cases with Y bits are a subset of the numbers that generate difficult patterns with Y−1 bits. Thus once the spacing of numbers that are difficult with Y−1 bits is determined, only these numbers need be examined when looking for the spacing of numbers difficult to round with Y bits. For example, if a difficult case of precision Y−1 has the trailing output pattern 1000, the corresponding possible cases for the trailing pattern in precision Y are 10000 and 10001. The first pattern, 10000, is difficult because if the intermediate precision arithmetic is imprecise, i.e., accurate only to a 1 or 2 more bits of precision, it cannot be known with certainty if this pattern will round up or down. However, the second pattern, 10001, is not difficult with the intermediate precision just described because it can be determined with certainty that even with a small error that the correctly rounded result will be on the high side of the half way case, i.e., it is not difficult to correctly round.

This process is continued until there are no further numbers to examine. Thus, a check is made to determine if all numbers have been examined, step 504. By all numbers being examined, it is meant that all numbers for the binade or decade have been examined. In the currently preferred embodiment, all numbers have been examined when the size of the difficult case spacings approaches the size of the set of numbers being examined. If all the numbers have not been examined, the steps 502–504 are repeated.

If all the numbers have been examined, all the difficult patterns in the last set of spacings found are then examined to determine how many extra bits are required for the most difficult case, step 505. This is done by increasing Y and examining all numbers in the last subset until no difficult cases occur. Once this is done, Y is stored as the precision for the intermediate arithmetic, step 506.

In practice this method enables the determination of the most difficult conversion for a large set of numbers while examining only a minuscule subset. For example, if it is desirable to correctly round all 36 decimal digit floating point numbers to 113 bit accurate binary floating point numbers, there is a potential of 10 **36 candidates for each decade that can be converted into the range defined by the floating point exponent range. It is estimated that examining each of these cases would require millions of years of computing time.

Difficult rounding cases are further illustrated with respect to FIG. 6. Referring to FIG. 6, the consecutive numbers of a decimal significand are marked Case A, B and C. The consecutive numbers marked Case 1–18 in the column labeled "binary significand" have 4 extra bits of precision (i.e. intermediate rounding precisions.) The binary point indicates the edge of the target precision. Considering directed roundings and rounding to the nearest case, cases 2 to 7, 10 to 15, & 18, can all be correctly rounded. Cases 1, 8, 9, 16 & 17 do not have sufficient information to determine the correct result for all rounding directions. These latter occurrences are difficult rounding cases.

As noted above, difficult cases at a particular precision do not provide accurate results for all rounding directions. Rounding directions refer to rounding-up or rounding down. Generally, there is a rounding threshold, e.g. the half-way point, which indicates the rounding direction. Difficult rounding cases span two potentially correct results. If rounding correctly to the binary point, and the result is guaranteed to at least one Unit in the Last Place (ULP), then the non-difficult cases can be correctly rounded. In other words, the correct rounding is unique for all rounding directions.

Referring back to FIG. 6, Cases 8 and 9, they are difficult because they are very near half-way cases. A half-way case is one that is half-way between two consecutive values of the target numeric format. For the Cases 8 and 9, the decimal significand being examined is Case B. So, for Case B, more than 4 extra bits of precision are needed to guarantee correctness. Cases 1, 16 and 17 are difficult because they are very near exact cases. An exact case is important for directed roundings.

As can be observed, there are no difficult cases of the binary significand associated with Cases A and C. Thus, 4 extra bits of precision yields a number that can be correctly rounded even if the last bit is incorrect.

It has been observed that the density of difficult case decreases when the number of extra bits increases. As noted above, the difficult cases are a pre-determined spacing apart. This pre-determined spacing significantly reduces the number cases that must be considered.

It has been determined that there are three (3) unique spacings, namely A, B and C, for difficult patterns with Y bits. It has been determined that the three unique spacings have the relationships C=A+B and A<B<C. Further, it has been determined that A and B are relatively prime. Referring back to FIG. 6, the cases 1, 8, 9, 16 & 17 are difficult cases. It is readily observable that these cases are separated by either 1, 7 or 8 in the lesser precision. Thus, when increasing the precision, only the cases with a spacing of 1, 7 or 8 need be examined as a difficult cases (and as described above, appending of a 1 or 0). Finding the first unique sparing requires sequentially examining each case, whereas subsequent examination is simplified by limiting the cases to be examined.

The foregoing calculation of the efficient amount of temporary storage is calculated once and then stored for subsequent use. An inherent advantage of this technique is that it insures consistent results across various computing platforms. This provides for increased inter-operability platforms.

The present invention may also be embodied in other computing elements. For example, the present invention may find use in special purpose processing environments such as Digital Signal Processors. Such use would not deport from the scope and spirit of the present invention.

Thus, a method and apparatus for efficient temporary storage allocation for generating correctly rounded conversions for any given set of binary and decimal ranges, is disclosed.

I claim:

1. On a computer system, a method for converting values between a first numeric format and a second numeric format, said method comprising the steps of:

a) identifying a most difficult rounding case in said first numeric format;

b) determining a minimum number of bits to represent said most difficult rounding case during conversion operations, said minimum number of bits being a least number of bits required to correctly round said most difficult rounding case during conversion from said first numeric format to said second numeric format;

c) establishing the minimum number of bits as a minimum precision;

d) storing, in a predetermined location, data that represents an intermediate precision, wherein said intermediate precision is based upon said minimum precision and has at least as many bits as said minimum precision;

e) invoking a conversion for a value to convert the value from said first numeric format to said second numeric format;

f) retrieving said data from said predetermined location;

g) storing a representation of said value in said intermediate precision;

h) converting said value to said second numeric format by performing conversion operations on said representation of said value.

2. A digital storage device containing said data stored according to the method recited in claim 1, said data representing said intermediate precision that is based upon said minimum precision.

3. The method of claim 1 wherein said step of identifying said most difficult rounding case in said first numeric format comprises the steps of:

a) initially establishing a number Y of storage bits as said minimum precision;

b) determining a current set of difficult rounding cases by identifying a current set of spacings between difficult rounding cases based on said first numeric format and the number Y of storage bits;

c) incrementing the number Y of storage bits;

d) determining a next set of difficult rounding cases by identifying a next set of spacings of difficult rounding cases based on the first numeric format, the number Y of storage bits, and said current set of spacings of difficult rounding cases;

e) if said next set of difficult rounding cases is not empty, then e1) establishing said next set of spacings of difficult cases as said current set of spacings of difficult rounding cases;

e2) establishing said next set of difficult rounding cases as said current set of difficult rounding cases;

e3) repeating steps c) through e) until said next set of difficult rounding cases is empty; and f) if said next set of difficult rounding cases is empty, then identifying said most difficult rounding case in said current set of difficult rounding cases.

4. The method as recited in claim 3 wherein said step of identifying a current set of spacings between difficult rounding cases based on said first numeric format and the number Y of storage bits is further comprised of the steps of:

a) finding a first difficult case and a second difficult case, said first difficult case and said second difficult case separated by a first spacing;

b) finding a third difficult case and a fourth difficult case, said third difficult case and said fourth difficult case separated by a second spacing that is different than said first spacing;

c) finding a fifth difficult case and a sixth difficult case, said fifth difficult case and said sixth difficult case separated by a third spacing, said third spacing being different than said first spacing and said second spacing; and d) establishing said first spacing, said second spacing and said third spacing as said current set of spacings.

5. The method as recited in claim 4 wherein said step of identifying a next set of spacings of difficult rounding cases based on the first numeric format, the number Y of storage bits, and said current set of spacings of difficult rounding cases is further comprised of the steps of:

a) determining whether numbers in said first numeric format that are separated by said current set of spacings are difficult rounding cases when represented using the number Y of storage bits;

wherein said step a) of determining includes a1) finding a seventh difficult case and an eighth difficult case, said seventh difficult case and said eighth difficult case separated by a fourth spacing;

a2) finding a ninth difficult case and a tenth difficult case, said ninth difficult case and said tenth difficult case separated by a fifth spacing different from said fourth spacing;

a3) finding a eleventh difficult case and a twelfth difficult case, said eleventh difficult case and said twelfth difficult case separated by a sixth spacing different from said fourth spacing and said fifth spacing; and a4) establishing said fourth spacing, said fifth spacing and said sixth spacing as said next set of spacings.

6. A method for determining a precision for significands used for converting values from a first numeric format to a second numeric format, the method comprising the steps of:

A) initially establishing said precision to be X bits;

B) determining a current set of spacings, wherein said current set of spacings are the spacings between numbers in said first numeric format that require more than the X bits for correct rounding to said second numeric format;

C) incrementing X;

D) inspecting numbers in said first numeric format that are spaced according to said current set of spacings to determine a new set of spacings, wherein said new set of spacings are spacings between the numbers in said first numeric format that require more than the X bits for correct rounding to said second numeric format;

E) establishing said new set of spacings as said current set of spacings;

F) repeating steps C) through E) until no numbers in said first numeric format require more than the X bits for correct rounding to said second numeric format;

G) establishing X as said precision for significands.

7. A digital storage device containing data that indicates a precision for significands used for converting values from a first numeric format to a second numeric format, wherein said precision is determined by performing the method recited in claim 6.

8. A method for determining a precision for significands used for converting values from a first numeric format to a second numeric format, the method comprising the computer-implemented steps of:

a) determining a most difficult number to convert from said first numeric format to said second numeric format;

b) determining a smallest precision for representing said most difficult number that is required to correctly round said most difficult number during conversion between said first numeric format and said second numeric format;

c) determining said precision for significands based on said smallest precision.

9. The method of claim 8 wherein said step of determining said most difficult number includes the steps of:

a) initially establishing a number Y of storage bits as a current precision;

b) determining a current set of difficult rounding cases by identifying a current set of spacings between difficult rounding cases based on said first numeric format and the number Y of storage bits;

c) incrementing the number Y of storage bits;

d) determining a next set of difficult rounding cases by identifying a next set of spacings between difficult rounding cases based on the first numeric format, the number Y of storage bits, and said current set of spacings between difficult rounding cases;

e) if said next set of difficult rounding cases is not empty, then e1) establishing said next set of spacings between difficult cases as said current set of spacings between difficult rounding cases;

e2) establishing said next set of difficult rounding cases as said current set of difficult rounding cases;

e3) repeating steps c) through e) until said next set of difficult rounding cases is empty; and f) if said next set of difficult rounding cases is empty, then identifying said most difficult number from said numbers in said current set of difficult rounding cases.

* * * * *

UNITED STATES PATENT AND TRADEMARK OFFICE
CERTIFICATE OF CORRECTION

PATENT NO. : 5,652,862
DATED : July 29, 1997
INVENTOR(S) : Kenton L. Hanson

It is certified that error appears in the above-identified patent and that said Letters Patent is hereby corrected as shown below:

Title page, item [54] and col. 1, delete "APPARTUS" and insert--APPARATUS--

Signed and Sealed this

Sixteenth Day of December, 1997

Attest:

BRUCE LEHMAN

*Attesting Officer*  *Commissioner of Patents and Trademarks*